(12) United States Patent
Ikeda

(10) Patent No.: US 7,755,895 B2
(45) Date of Patent: Jul. 13, 2010

(54) HEAT SINK, AN ELECTRONIC COMPONENT PACKAGE, AND A METHOD OF MANUFACTURING A HEAT SINK

(75) Inventor: Hironobu Ikeda, Tokyo (JP)

(73) Assignee: NEC Corporation, Tokyo (JP)

( * ) Notice: Subject to any disclaimer, the term of this patent is extended or adjusted under 35 U.S.C. 154(b) by 165 days.

(21) Appl. No.: 11/356,129

(22) Filed: Feb. 17, 2006

(65) Prior Publication Data

US 2006/0185896 A1  Aug. 24, 2006

(30) Foreign Application Priority Data

Feb. 22, 2005  (JP) .............................. 2005-045398

(51) Int. Cl.
H05K 7/20 (2006.01)

(52) U.S. Cl. .................. 361/704; 361/719; 257/713; 313/46; 313/582; 165/185

(58) Field of Classification Search ................. 361/719, 361/704, 707, 710, 717; 313/46, 582, 493, 313/573; 257/718, 727; 165/80.3, 185
See application file for complete search history.

(56) References Cited

U.S. PATENT DOCUMENTS

| | | | |
|---|---|---|---|
| 4,254,447 A | * 3/1981 | Griffis | .................. 361/719 |
| 5,168,348 A | * 12/1992 | Chu et al. | .................. 257/713 |
| 5,464,054 A | * 11/1995 | Hinshaw et al. | ............ 165/80.3 |
| 5,489,999 A | 2/1996 | Matsumoto | |
| 5,831,374 A | * 11/1998 | Morita et al. | .................. 313/46 |
| 5,990,618 A | * 11/1999 | Morita et al. | ............... 313/582 |
| 6,809,930 B2 | * 10/2004 | Mueller et al. | ............... 361/704 |
| 2005/0000682 A1 | * 1/2005 | Chien et al. | ................ 165/80.3 |
| 2005/0024573 A1 | 2/2005 | Suzuki | |

FOREIGN PATENT DOCUMENTS

| | | |
|---|---|---|
| CN | 1161621 | 8/1997 |
| JP | 2-78255 | 3/1990 |
| JP | 10-275968 | 10/1998 |
| JP | 2001-085577 | 3/2001 |
| JP | 2003-218294 | 7/2003 |
| JP | 2005-49774 | 2/2005 |

OTHER PUBLICATIONS

Chinese Office Action dated Jan. 4, 2008 with English Translation.
Chinese Office Action dated Jul. 18, 2008 with English-Language Translation.
Japanese Office Action dated Feb. 9, 2010 (with partial English translation).

* cited by examiner

*Primary Examiner*—Jayprakash N Gandhi
*Assistant Examiner*—Courtney Smith
(74) *Attorney, Agent, or Firm*—McGinn IB Law Group, PLLC

(57) ABSTRACT

A heat sink for an electronic component includes a structure that is bendable.

17 Claims, 8 Drawing Sheets

HEAT SINK, AN ELECTRONIC COMPONENT PACKAGE, AND A METHOD OF MANUFACTURING A HEAT SINK

BACKGROUND OF THE INVENTION

1. Technical Field

The present invention relates to a heat sink which causes the heat generated by electronic components (e.g., semiconductors mounted on a substrate) to be dissipated and a mounting structure (e.g., an electronic component package) thereof.

2. Conventional Technique

As mounting structures of a semiconductor integrated circuit (hereinafter referred to as an "LSI" (Large Scale Integration)), there are available a structure in which a "QFP" (Quad Flat Package) or a "BGA" (Ball Grid Array) are used in which a silicon chip is built is mounted on a printed wiring board, and a flip chip mounting in which a bare LSI is mounted on a printed wiring board, etc. In all these cases, generally, a heat sink is mounted on an LSI which generates heat.

An example of a conventional mounting structure of a heat sink is described in Japanese Patent Laid-Open No. 10-275968 (Patent Document 1). In the mounting structure of a heat sink, the heat sink is placed on a top surface of an LSI mounted on a printed wiring board via a thermal conductive sheet, and this heat sink is fixed by being pushed against the LSI by a fixing member having spring properties. The heat sink has a bottom surface which is substantially flat, and a plurality of fins are formed on a surface opposite to the bottom surface.

Another example of a mounting structure of a heat sink is described in Japanese Patent Laid-Open No. 2001-85577 (Patent Document 2). In the mounting structure of a heat sink, slits of an arbitrary shape, such as Π-shaped slits (e.g., U-shaped slits), dual rectangular-shaped slits and H-shaped slits, are formed on a plate-like heat sink and flexibility is imparted to a portion where the heat sink is coupled to an LSI (a region which encloses an LSI to which the heat sink is to be connected and is called a "component adjoining region"). By selectively deforming the component adjoining region, the component adjoining region of the heat sink is brought into close contact with the top surface of the LSI in the mounting of a package of low thermal resistant T-BGA type.

SUMMARY OF THE INVENTION

Exemplary Problems to be Solved by the Invention

In recent years, the high integration design and high speed design of LSIs have advanced with higher performance of computers, and as means for transmitting a larger number of electric signals of LSIs at higher speeds, flip chip mounting in which LSIs are solder mounted directly on a printed wiring board, has been frequently adopted. In almost all CPUs of computers, the flip chip mounting structure has been adopted.

Also, at the same time, the power consumption of LSIs has increased and cooling structures of high efficiency have been desired. In the flip chip mounting in which an LSI is solder mounted directly on a printed wiring board, a convex bow occurs in the LSI due to a difference in the coefficient of thermal expansion between the LSI and the printed wiring board. This may cause many exemplary problems.

For example, when a heat sink having a flat bottom surface is disposed on a bowed LSI via a thermal conductive grease, a difference in the thickness of the thermal conductive grease occurs between the middle part and the peripheral part of the LSI. Thus, the thermal resistance is high in the portion where the thermal conductive grease is thick, resulting in a poor coefficient of thermal conductivity, for example.

Although it is conceivable that the bottom surface of the heat sink is worked into a concave shape so as to fit the bow of the LSI, this working is performed on the order of several tens of micrometers and thus is difficult and costs increase.

The heat sink described in Patent Document 2 has flexibility because it has slits. However, because making the slits aim to compensate for a gap between a package of low thermal resistant T-BGA type and the heat sink generated by variations in the height of chips and the inclination of chips in mounting the package, the component adjoining region of the heat sink is designed so that the whole region is bent to have a flat condition. That is, the component adjoining region is not easily bent to halves, for example.

Therefore, when this heat sink is applied to an LSI having a convex top surface, the component adjoining region is not deformed so as to fit the convex shape and hence for example, good heat dissipating properties cannot be expected.

In view of the foregoing and other exemplary problems, drawbacks, and disadvantages of the conventional techniques, it is an exemplary feature of the present invention to provide a heat sink, an electronic component package, and a method of manufacturing a heat sink. The heat sink is placed on an electronic component, such as an LSI. The heat sink deforms so as to fit the shape of a top surface of an electronic component, and a mounting structure of the heat sink.

The present invention provides a heat sink for an electronic component that includes a structure that is bendable.

The present invention also provides an electronic component package that includes a substrate, an electronic component mounted on the substrate; and the heat sink above.

The present invention also provides a heat sink for an electronic component that includes a structure that dissipates heat, and means for allowing the structure to bend.

The present invention also provides a method of manufacturing a heat sink that includes dividing a bottom surface of the heat sink into multiple partial regions.

Exemplary Advantages of the Invention

According to the present invention, a heat sink including a good mounting structure of the heat sink may be obtained. The reason for this is that the heat sink placed on an electronic component, such as an LSI, may be deformed so as to fit the shape of the electronic component with which the heat sink is in contact.

BRIEF DESCRIPTION OF THE DRAWINGS

The novel and exemplary features believed characteristic of the invention are set forth in the appended claims. The invention itself, however, as well as other exemplary features and advantages thereof, will be best understood by reference to the detailed description which follows, read in conjunction with the accompanying drawings, wherein:

DETAILED DESCRIPTION OF THE EXEMPLARY EMBODIMENTS

Operation

A heat sink of the present invention has a structure which is easily bent along lines which divide a bottom surface into multiple partial regions. Therefore, if the heat sink is placed on an electronic component and the heat sink is fixed by use of a fixing member such that the heat sink is pushed against the electronic component in a position near (e.g., adjacent) the middle where the partial region of the heat sink overlaps the electronic component, then the heat sink may be deformed so as to fit the shape of the electronic component with which the heat sink is in contact.

As a result, the average distance between the electronic component and the heat sink may become narrow and for example heat dissipating properties may be optimized (e.g., thermal resistance can be reduced).

As a result, the cooling efficiency may be improved, thereby contributing to the adoption of a high performance LSI of large power consumption or the miniaturization of a device.

Figure 1A:
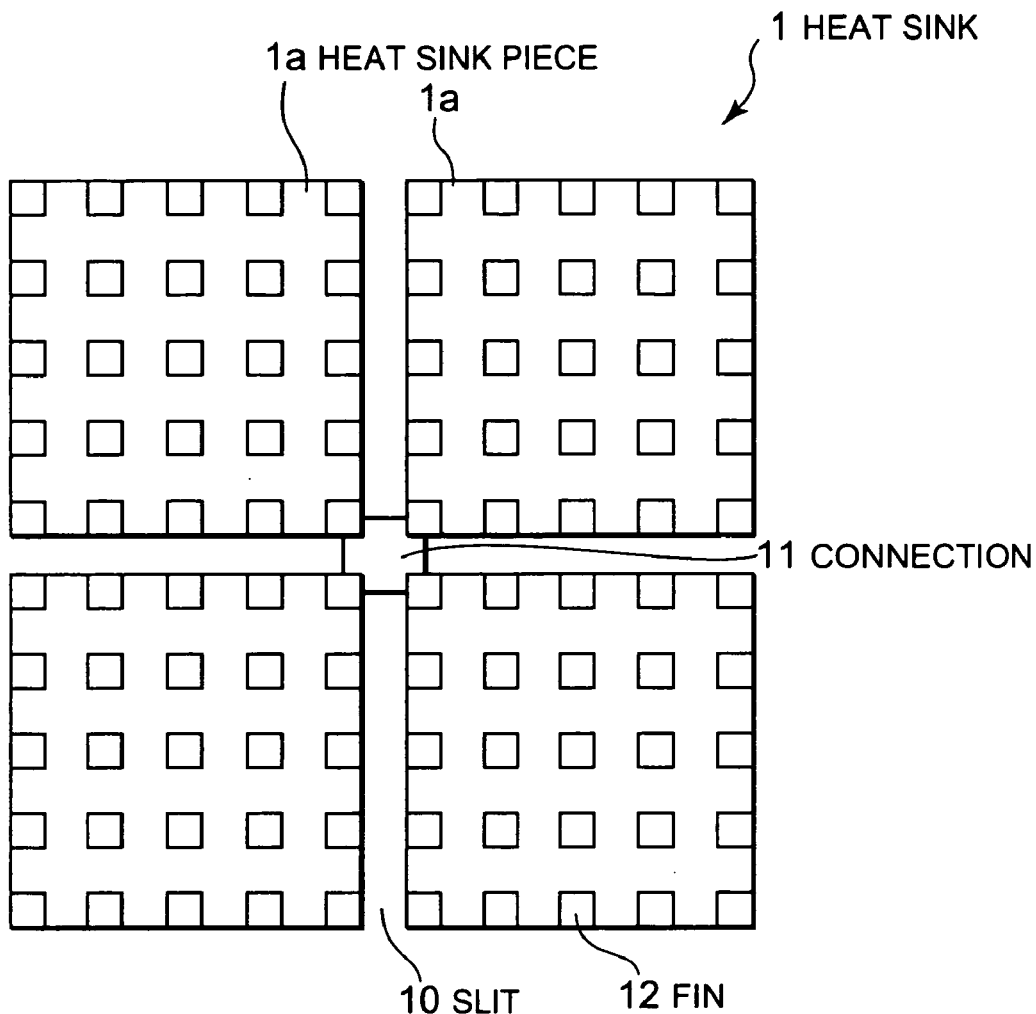
FIGS. 1A and 1B show exemplary plan views and an exemplary side view of heat sink 1 related to the first exemplary embodiment of the present invention.
Figure 1B:
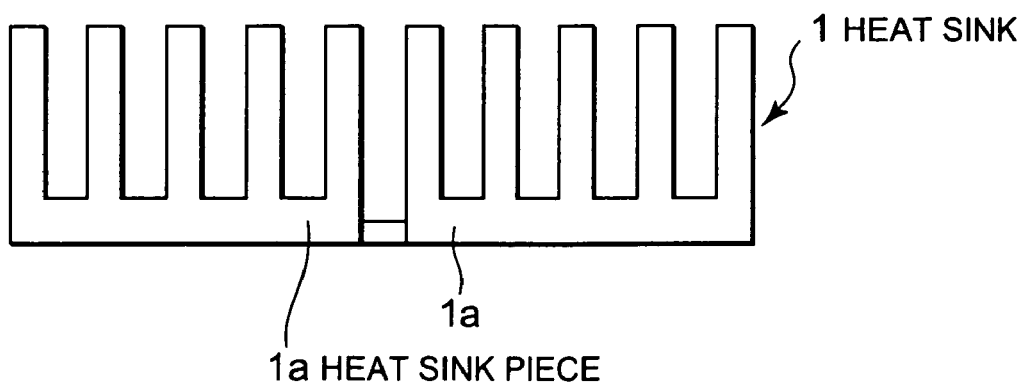

Referring to FIGS. 1A and 1B, in heat sink 1 related to the first exemplary embodiment of the present invention, a plurality (e.g., four) of slits 10 which extend from an outer circumference of a bottom surface to connection 11 in the middle may be formed (e.g., formed in the shape of a cross). Four heat sink pieces 1a divided by slits 10 may be connected at connection 11 alone, for example. The width of slits 10 may be as fine as 0.1 mm or so, for example. The bottom surface of each heat sink piece 1a may be flat. Also, on the side opposite to the bottom surface, a large number of bar-like fins 12 may be provided in a standing manner in a grid pattern.

Slit 10 shown in the first exemplary embodiment includes an opening. For example, slit 10 may include trench, as shown in the third exemplary embodiment below.

The whole heat sink 1 including connection 11 and the heat sink pieces 1a may be integrally formed from a material excellent in the coefficient of thermal conductivity, such as aluminum and/or copper, etc., and the thickness of connection 11 of the bottom surface may be worked thin compared to the thickness of the bottom surface of the heat sink pieces 1a, for example. For this reason, the four heat sink pieces 1a are easily bendable at connection 11.

Figure 8A:
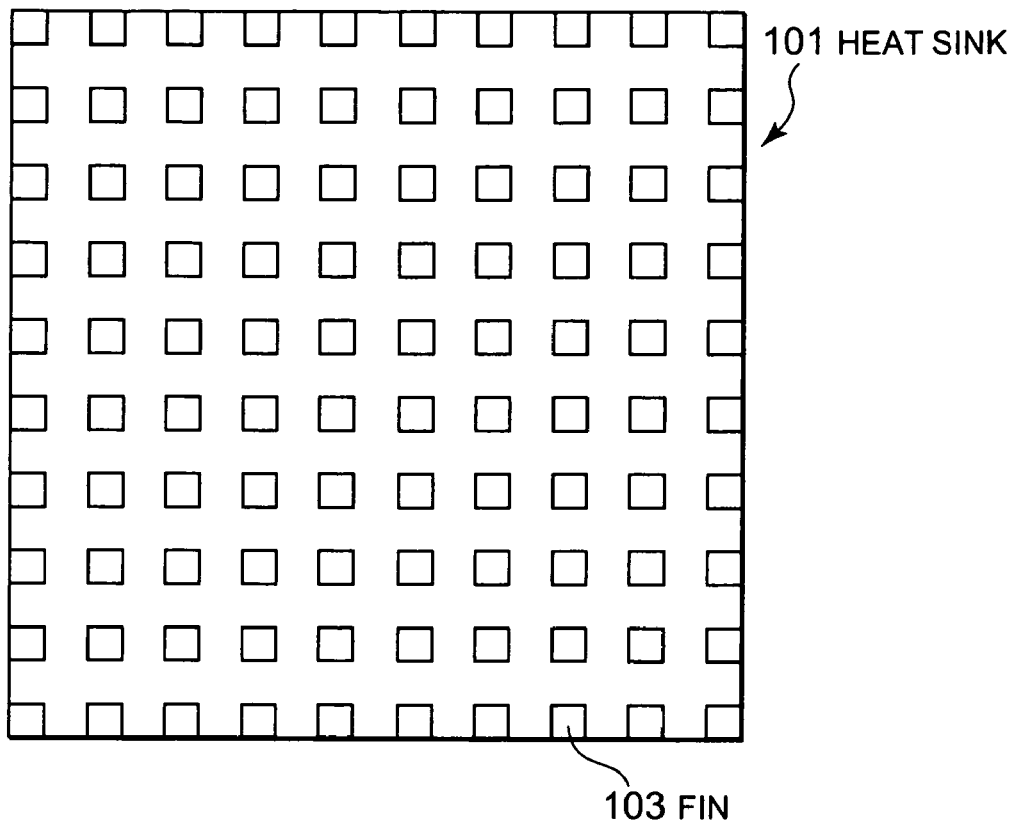
FIGS. 8A and 8B show an exemplary plan view and an exemplary side view of conventional general heat sink 101.
Figure 8B:
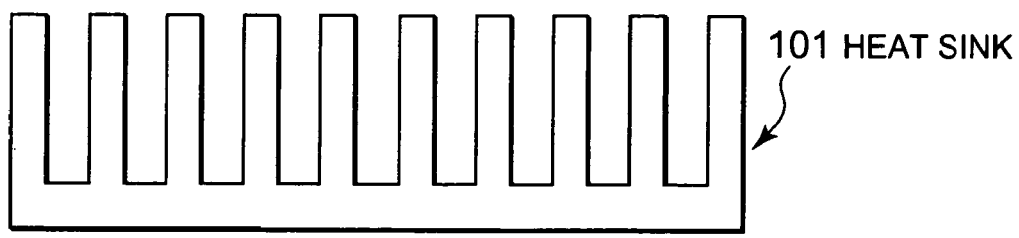

This heat sink 1 may be manufactured by cutting heat sink 101 as shown in FIGS. 8A and 8B, which will be described later, whereby slits 10 are provided and the thickness of connection 11 may be worked thin.

Figure 2A:
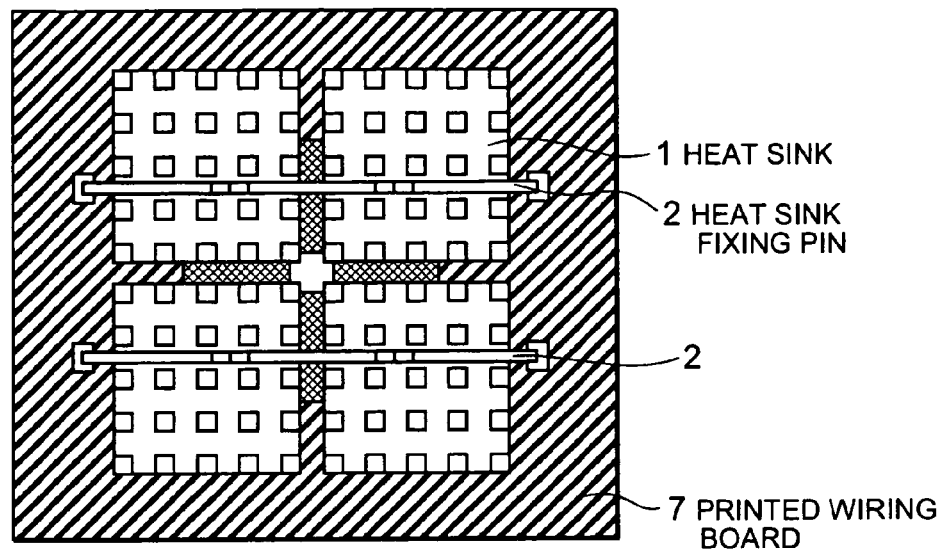
FIGS. 2A and 2B show an exemplary plan view and an exemplary longitudinal sectional view of a mounting structure of heat sink 1 related to the first exemplary embodiment of the present invention.
Figure 2B:
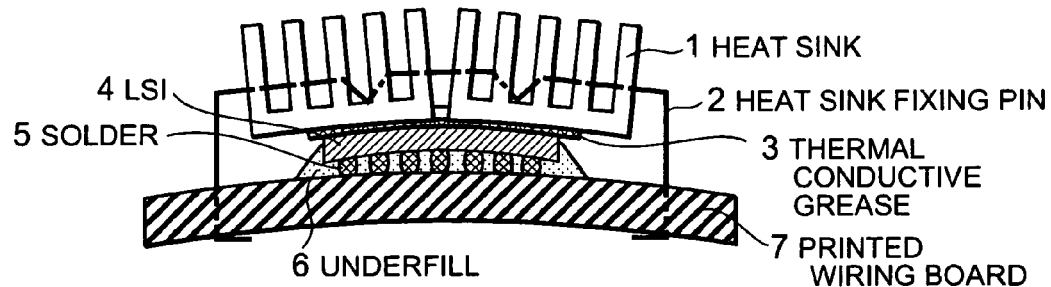
Figure 3:
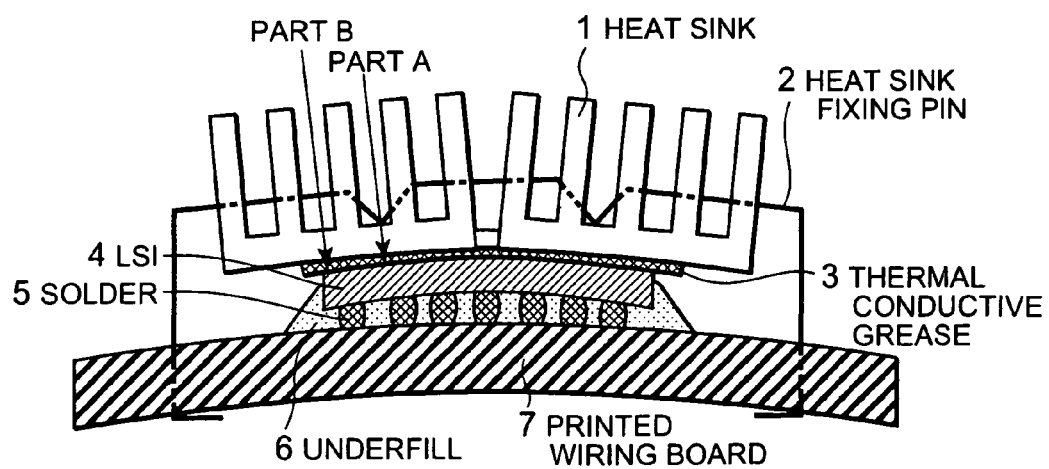
FIG. 3 shows an exemplary enlarged view of the longitudinal section of a mounting structure of heat sink 1 related to the first exemplary embodiment of the present invention.

Referring to FIGS. 2A and 2B and FIG. 3, for example, a heat sink mounted structure (e.g., an electronic component package) related to the present invention may include heat sink 1 shown in FIG. 1, heat sink fixing pins 2, thermal conductive grease 3, LSI 4, solder 5, underfill 6, and printed wiring board 7.

As shown in FIGS. 2A and 2B, for example, LSI 4 is solder-mounted by use of solder 5 on printed wiring board 7, and underfill 6 is filled and hardened between LSI 4 and printed wiring board 7. At this time, due to a difference in the coefficient of thermal expansion between LSI 4 and printed wiring board 7, a convex bow occurs on the back surface side of LSI 4 (the upper side in FIG. 2B). Thermal conductive grease 3 may be applied to the back surface of LSI 4, heat sink 1 is place on thermal conductive grease 3, and heat sink 1 is fixed by a heat sink fixing pin 2 having the beam section of which has spring (elastic) properties.

Both ends of a leg portion which extends downwardly from the beam section of the heat sink fixing pin 2 have a shape which enables the ends to be caught by the back surface of printed wiring board 7 through mechanical holes of printed wiring board 7, and a force which pushes heat sink 1 to LSI 4 side works owing to the spring force of the beam section. The heat sink fixing pin 2 is worked so that it pushes the middle of a portion where each of the heat sink pieces 1a overlaps LSI 4. As a result, heat sink 1 is deformed so as to fit the shape of the bow of LSI 4. This exemplary feature is described more.

As shown in FIG. 3, for example, in a flip chip mounting structure (e.g., an electronic component package) in which LSI 4 is mounted directly on printed wiring board 7 by use of solder 5, the soldered portion is very fine, and hence is reinforced by filling and hardening underfill 6, thereby to ensure reliability. For the assembly procedure, LSI 4 is positioned and mounted so that an LSI mounting pad (not shown) on printed wiring board 7 and solder 5 of LSI 4 are opposed to each other, heating is performed to a temperature at which solder 5 melts (for example, 183° C. in the case of Sn63/Pb37 (wt %)) or above, and soldering is performed.

For example, a resin for underfill 6 may be supplied sideways to the gap between printed wiring board 7 and LSI 4 and filled, and the resin is heated and hardened at the hardening temperature of the resin (for example, 150° C.). At 150° C. during the hardening of the underfill resin, printed wiring board 7 and LSI 4 are in such a condition that the two are in contact with the respective flat surfaces.

However, when printed wiring board 7 and LSI 4 are cooled to room temperature (for example, 25° C.) after hardening, the bimetal phenomenon occurs because the coefficient of thermal expansion of printed wiring board 7 is larger than that of LSI 4, and a bow which produces a convexity on LSI 4 side occurs.

Because the coefficient of thermal expansion of LSI 4 is about 3 ppm and a coefficient of thermal expansion of the printed wiring board (for example, FR4) is about 16 ppm, a bow of LSI 4 of about 100 µm occurs if the outer shape of LSI 4 is about 20 mm square.

Next, for example, thermal conductive grease 3 may be applied to the back surface of LSI 4, heat sink 1 is placed on thermal conductive grease 3, and heat sink 1 is fixed by being pushed against LSI 4 with a leading end of a bent portion provided in the beam section of the heat sink fixing pin 2.

As shown in FIG. 1, for example, slits 10 are provided in four places of heat sink 1, and heat sink 1 is divided into four parts, which are connected at connection 11. Connection 11 is worked thin so that heat sink 1 is easily deformable. Because the width of slits 10 is very small, this size is not a level which might exert an influence on the heat dissipation effect of the heat sink.

For example, the place of the bent portion at which the heat sink fixing pin 2 pushes heat sink 1 is worked so that this place coincides with an area near the middle of the LSI portion which overlaps each of the heat sink pieces 1a. Both ends of the heat sink fixing pin 2 are fixed such that the ends pass through mechanical holes in printed wiring board 7 and are caught by the back surface of printed wiring board 7.

In this exemplary embodiment, two heat sink pieces 1a are fixed by one heat sink fixing pin 2 having two bent portions in the beam section. However, four bent portions may be formed in the beam section of an integrated heat sink fixing pin which is worked in frame form, and the four heat sink pieces 1a of heat sink 1 may be fixed by being pushed against the LSI side with one heat sink fixing pin. Also, another structure may be adopted as the structure which fixes the heat sink by pushing the heat sink against the LSI side.

As described above, for example, heat sink 1 provided with slits 10 is placed on LSI 4 in which a bow has occurred and heat sink 1 is fixed by the heat sink fixing pin 2, whereby as shown in FIG. 3, heat sink 1 is deformed so as to fit the bow of LSI 4. When the bow of LSI 4 is 100 µm, the part where thermal conductive grease 3 is thinnest is Part A, and the part where it is thickest is Part B. If Part A is about 20 µm thick, Part B is about 45 µm thick. The average thickness of the thermal conductive grease at this time is roughly estimated by $(20+45)/2$ and is equivalent to about 33 µm.

Figure 9A:
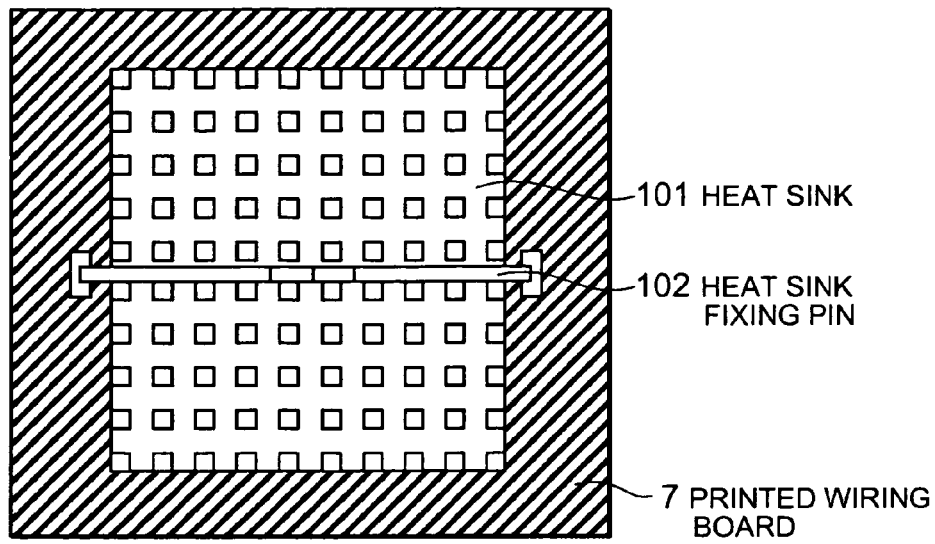
FIGS. 9A and 9B show an exemplary plan view and an exemplary longitudinal sectional view of a conventional general mounting structure of heat sink 101.
Figure 9B:
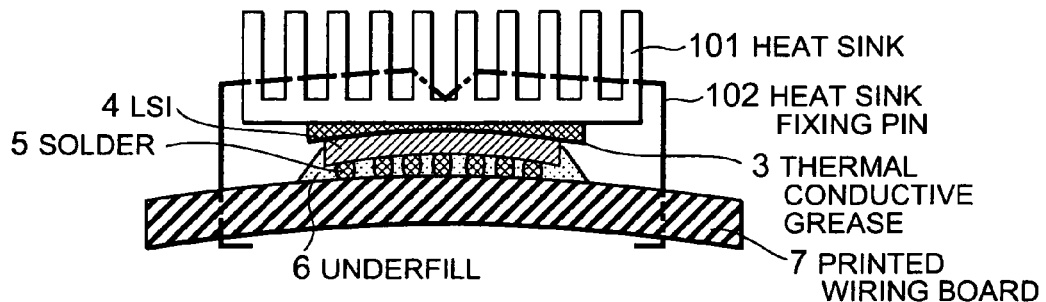
Figure 10:
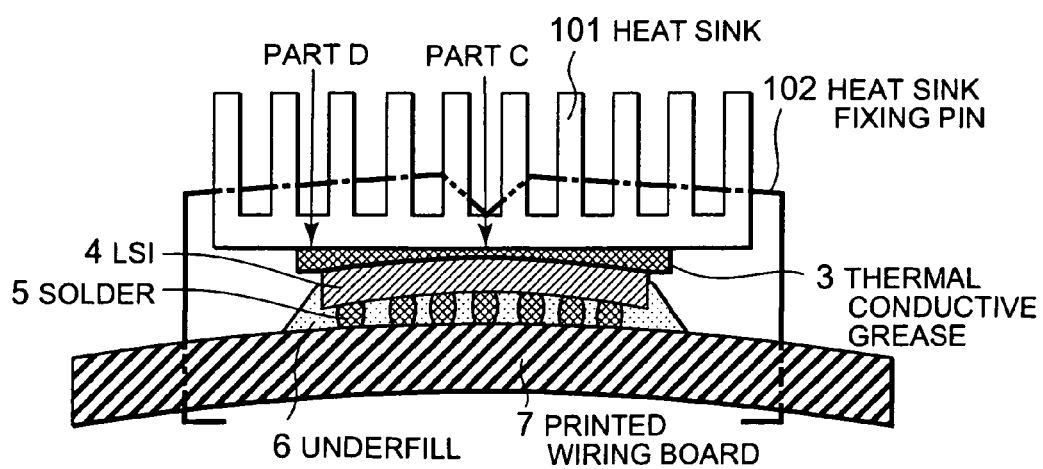
FIG. 10 shows an exemplary enlarged view of the longitudinal section of a conventional general mounting structure of heat sink 101.

In contrast, in a mounting structure (e.g., an electronic component package) as shown in FIGS. 9A and 9B and FIG. 10 in which a conventional heat sink 101 in which no slit is formed as shown in FIGS. 8A and 8B is used, thermal conductive grease 3 is applied to a top surface of LSI 4, heat sink 101 is placed on thermal conductive grease 3, and heat sink 101 is fixed by heat sink fixing pin 102 by pushing the middle of heat sink 101 against LSI 4 side.

When the bow of LSI 4 is 100 µm, the thickness of Part C of the thermal conductive grease in the middle of the LSI is about 20 µm, whereas the thickness of Part D of the thermal conductive grease in the peripheral part of LSI 4 is about 120 µm thick. Therefore, the average thickness of thermal conductive grease 3 is roughly estimated by $(120+20)/2$ and is equivalent to about 70 µm.

As is apparent from the foregoing, in the mounting structure (e.g., an electronic component package) of this exemplary embodiment, the thickness of thermal conductive grease 3 may be reduced to about a half of the thickness of the mounting structure (e.g., an electronic component package) in which the conventional heat sink 101 is used.

For example, in a case where the heat release value of LSI 4 is about 100 W and the thermal resistance of the part to which the thermal conductive grease is applied in the mounting structure (e.g., an electronic component package) of FIGS. 9A and 9B and FIG. 10 is 0.2° C./W, a temperature rise of about 20° C. occurs in the part to which the thermal conductive grease is applied.

However, because in the present invention, the thickness of the thermal conductive grease is about a half, thermal resistance also becomes a half and a temperature rise of 10° C. may be improved.

In this exemplary embodiment, the present invention may be applied to a structure in which an LSI is flip chip mounted on a printed wiring board. However, as shown in FIG. 4, the structure of the present invention may also be applied to a flip chip BGA 112 in which a BGA substrate 110 is mounted on printed wiring board 7 by use of a solder 111, LSI 4 is solder mounted on this BGA substrate 110 by use of solder 5, and underfill 6 is filled and hardened between LSI 4 and the BGA substrate 110.

Figure 4:
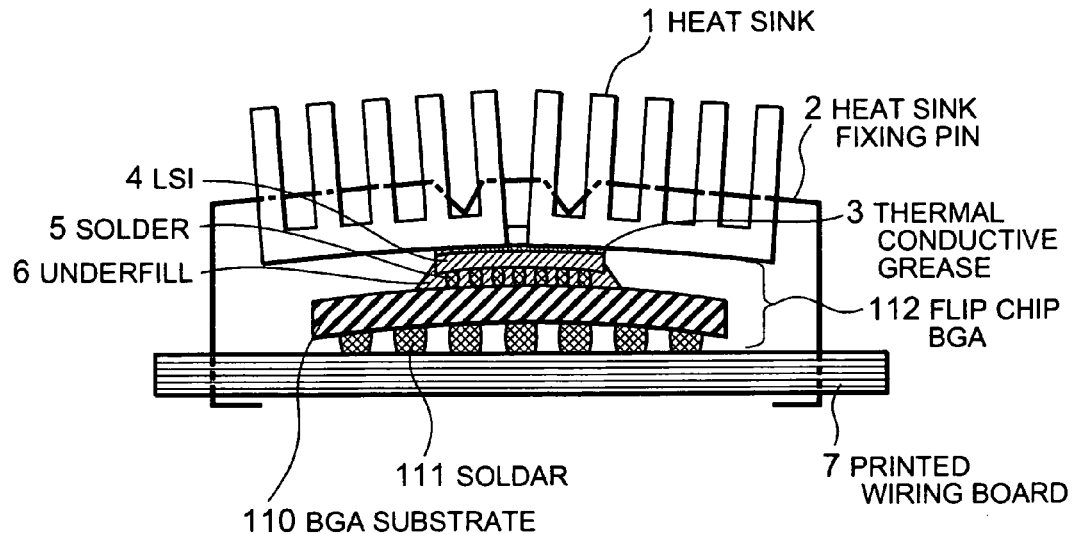
FIG. 4 shows an exemplary longitudinal section of a structure of heat sink 1 of the present invention related to another exemplary embodiment.
Figure 5:
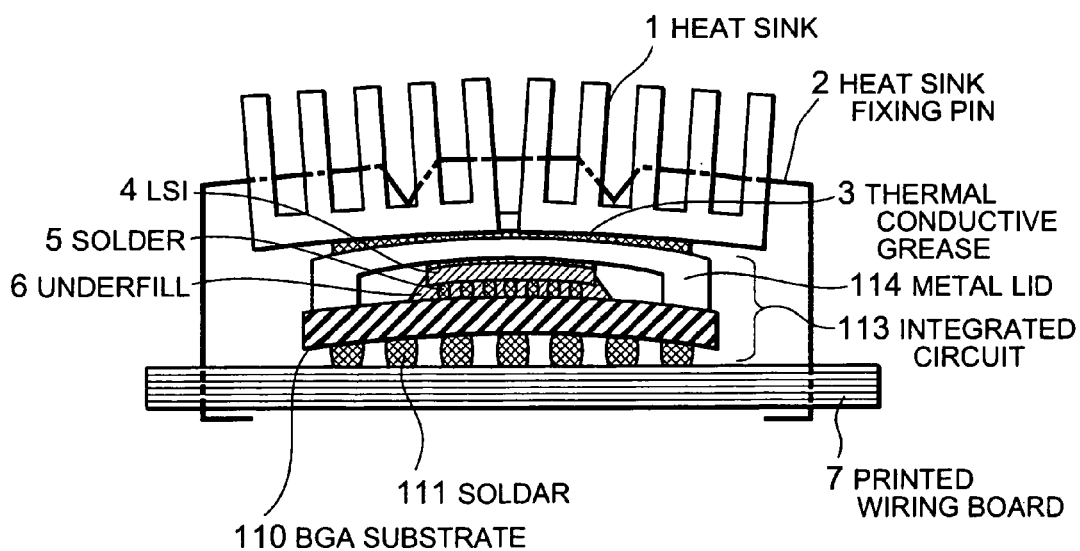
FIG. 5 shows an exemplary longitudinal section of a structure of heat sink 1 of the present invention related to still another exemplary embodiment.

The present invention may also be applied to an integrated circuit with a metal lid having the structure shown in FIG. 5 in which the metal lid covering LSI 4 shown in FIG. 4 is provided. Furthermore, the structure of the present invention is also applicable to a structure in which an LSI of QFP type is mounted, though not illustrated, and whether the shape of an LSI is convex or concave, the structure of the present invention can be applied because the heat sink adapts to fit the shape of the LSI.

Figure 6A:
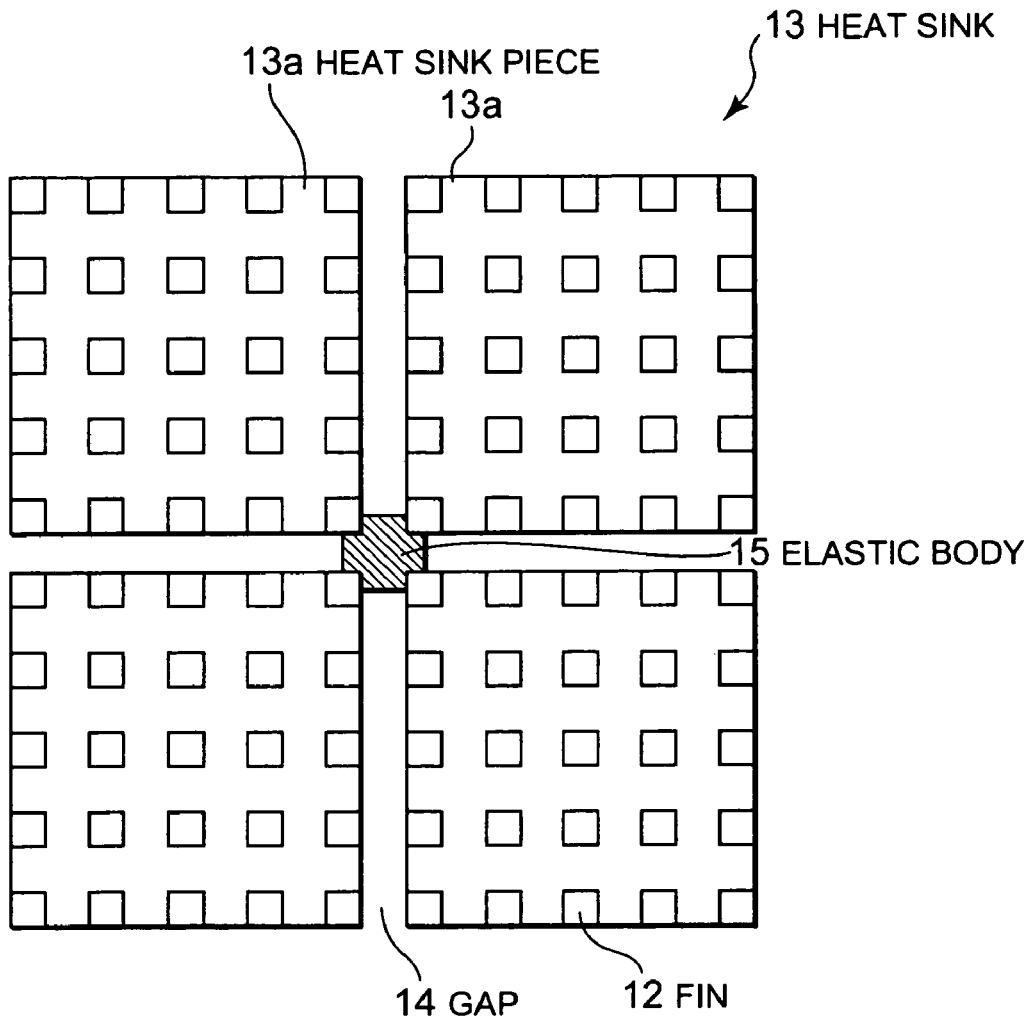
FIG. 6A-6C show an exemplary plan view and an exemplary side view of heat sink 1 related to the second exemplary embodiment of the present invention.
Figure 6B:
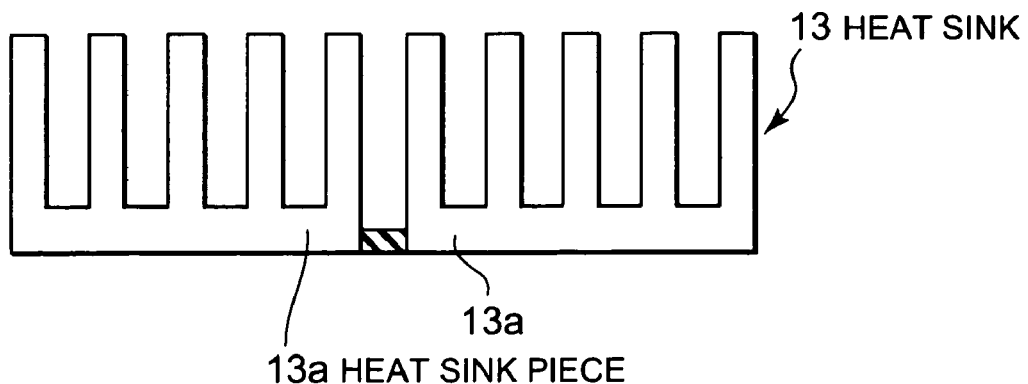

With reference to FIGS. 6A and 6B, in heat sink 13 related to the second exemplary embodiment of the present invention, four heat sink pieces 13a may be connected by an elastic body (for example, rubber, plastic, etc.) 15. A minute gap 14 (for example, 0.1 mm) is provided between the adjacent heat sink pieces 13a. That is, heat sink 13 in this exemplary embodiment corresponds to a heat sink in which connection 11 of heat sink 1 shown in FIG. 1 is formed from the elastic body 15 of a material different from the material for the heat sink pieces.

Functionally, this heat sink 13 may be the same as heat sink 1 of FIG. 1, and the structure of FIGS. 6A and 6B is more effective in terms of deformability. Incidentally, this heat sink 13 may be made by bonding the four heat sink pieces 13a and the elastic body together with an adhesive, etc.

Figure 6C:
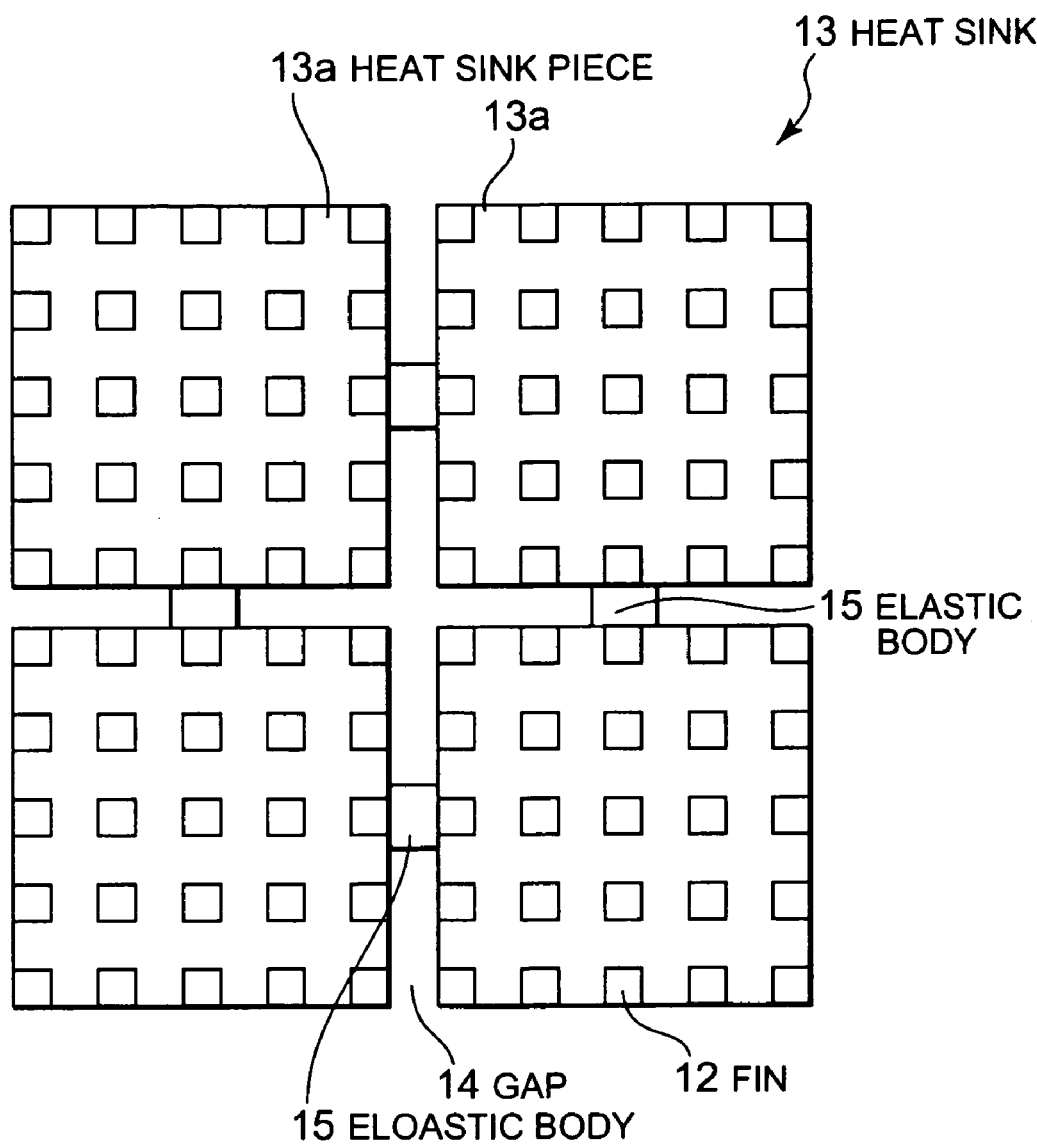

In FIGS. 6A and 6B, four heat sink pieces 13a divided by gaps 14 are connected at elastic body 15 in the middle of heat sink 13 as shown. Of course, another variation of a position and/or number of elastic body 15 may be performed. For example, in FIG. 6C, four heat sink pieces 13a may be connected at four elastic bodies 15. For example, one heat sink piece 13a is connected to another heat sink piece 13a at a desired position (e.g., the middle) of the side of each of heat sinks 13a.

Figure 7A:
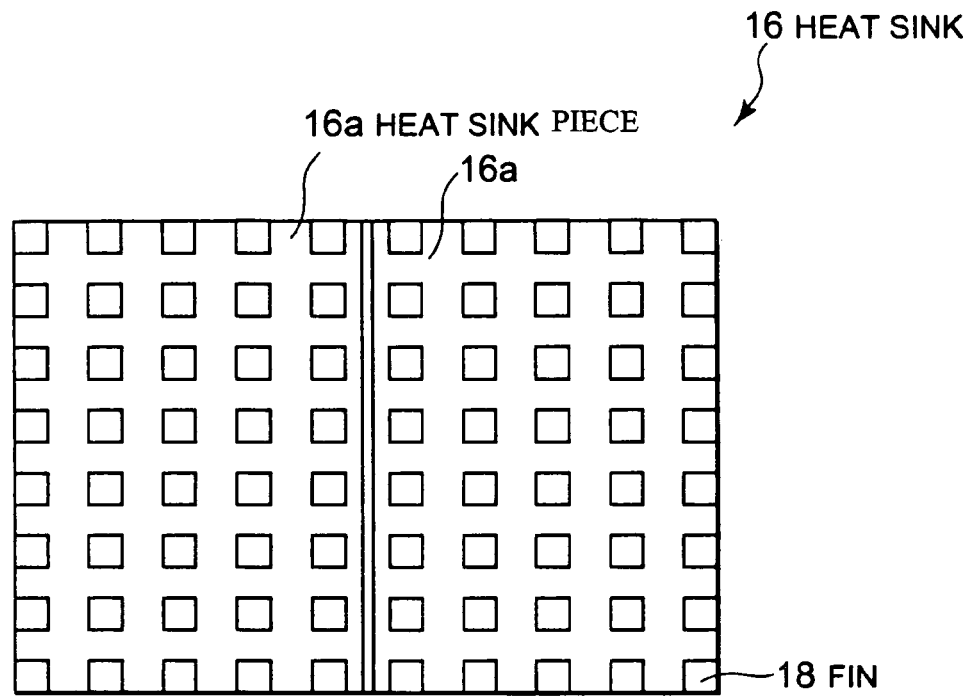
FIGS. 7A and 7B show an exemplary plan view and an exemplary side view of heat sink 1 related to the third exemplary embodiment of the present invention.
Figure 7B:
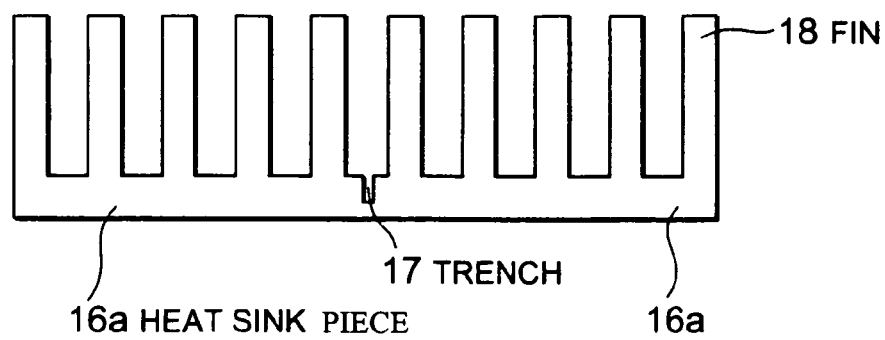

With reference to FIG. 7, in heat sink 16 related to the third exemplary embodiment of the present invention, one trench 17 may be provided so as to traverse almost a middle portion of the bottom surface and heat sink 16 is easily bendable in the part of the trench 17, for example. In the case of this exemplary structure, the number of heat sink pieces 16a is two at most. Therefore, this exemplary structure is effective for a rectangular LSI etc. although the structure may be a little inferior in the effect of a reduction in the thickness of a thermal conductive grease between heat sink 16 and an LSI unlike the structure of FIG. 1.

This structure has the advantage that a cost reduction may be achieved. Incidentally, the trench 17 is not limited to one trench in the middle as shown in FIG. 7, and one or more trenches may be provided on one side or both sides of this trench in the middle. That is, multiple trenches may be provided. Heat sink 16 can be manufactured by cutting the trench 17 in heat sink 101 as shown in FIGS. 8A and 8B, for example. As evident to one of ordinary skill in the art, the depth of trench 17 is designed so that heat sink 16 is bendable and heat sink 16 does not rupture.

The mounting structure (e.g., an electronic component package) of the above-described heat sinks 13, 16 related to the second and third exemplary embodiments is basically the same as in the first embodiment shown in FIGS. 2A and 2B and FIG. 3.

While this invention has been described with reference to exemplary embodiments, this description is not intended as limiting. Various modifications of the illustrative embodiments, as well as other embodiments of the invention, will be apparent to persons skilled in the art upon taking description as a whole. It is, therefore, contemplated that the appended claims will cover any such modifications or embodiments as fall within the true scope of the invention.

Further, the inventor's intent is to encompass all equivalents of all the elements of the claimed invention even if the claims are amended during prosecution.

This application is based on Japanese Patent Application No. 2005-045398 filed on Feb. 22, 2005 and including specification, claims, drawings and summary. The disclosure of the above Japanese Patent Application is incorporated herein by reference in its entirety.

What is claimed is:

1. A heat sink for an electronic component, said heat sink comprising:
    a structure that is bendable; and
    a slit formed in said structure,
    wherein said slit includes an opening,
    wherein multiple heat sink pieces divided by said slit are bendable at a connection,
    wherein each of said heat sink pieces includes a bottom part and a fin part,
    wherein adjacent bottom parts are separated from each other except at said connection,
    wherein said opening extends from said connection to an outer periphery edge of said adjacent bottom parts, and opens the outer periphery edge of said adjacent bottom parts, and
    wherein each of said adjacent bottom parts is connected at one end of each of said adjacent bottom parts, and each of said adjacent bottom parts is free at said outer periphery edge.

2. The heat sink according to claim 1, wherein said structure is bendable to conform substantially to said electronic component.

3. The heat sink according to claim 1, wherein said structure is bendable along lines which divide a bottom surface of said heat sink into multiple partial regions.

4. The heat sink according to claim 1, wherein said slit extends from an outer circumference of a bottom surface to a middle of said bottom surface.

5. The heat sink according to claim 1, wherein said connection and said heat sink pieces are integrally formed from a same material and said connection has a predetermined thickness so as to be bendable.

6. The heat sink according to claim 1, wherein four slits are formed and four heat sink pieces are connected at said connection.

7. The heat sink according to claim 6, wherein said slits are formed in a shape of a cross.

8. An electronic component package, comprising:
    a substrate;
    an electronic component mounted on said substrate; and
    said heat sink according to claim 3.

9. The electronic component package according to claim 8, further comprising:
    a fixing member that fixes said heat sink to said electronic component.

10. A heat sink for an electronic component, said heat sink comprising:
    a structure that dissipates heat;
    means for allowing said structure to bend; and
    means for forming a slit in said structure,
    wherein said slit includes an opening,
    wherein multiple heat sink pieces divided by said slit are bendable at a connection,
    wherein each of said heat sink pieces includes a bottom art and a fin part,
    wherein adjacent bottom tarts are separated from each other except at said connection,
    wherein said opening extends from said connection to an outer periphery edge of said adjacent bottom parts, and opens the outer periphery edge of said adjacent bottom parts, and
    wherein each of said adjacent bottom parts is connected at one end of each of said adjacent bottom each of said adjacent bottom parts is free at said outer periphery edge.

11. A method of manufacturing a heat sink, said method comprising:
    dividing a bottom surface of said heat sink into multiple partial regions;
    forming a slit in said heat sink so that adjacent partial regions are bendable along said slit;
    forming an opening as said slit; and
    forming a connection so that said adjacent partial regions are bendable at said connection,
    wherein each of said heat sink pieces includes a bottom art and a fin part,
    wherein adjacent bottom parts are separated from each other except at said connection,
    wherein said opening extends from said connection to an outer periphery edge of said adjacent bottom parts, and opens the outer periphery edge of said adjacent bottom parts, and
    wherein each of said adjacent bottom carts is connected at one end of each of said adjacent bottom parts, and each of said bottom parts is free at said outer periphery edge.

12. The heat sink according to claim 1, wherein said outer periphery edge of said adjacent bottom parts is free.

13. The heat sink according to claim 10, wherein said outer periphery edge of said adjacent bottom parts is free.

14. The method of manufacturing the heat sink according to claim 11, wherein said outer periphery edge of said adjacent bottom parts is free.

15. The heat sink according to claim 1, wherein said heat sink pieces comprise a plurality of fins, a portion of said fins being in direct contact with said outer periphery edge of said adjacent bottom parts.

16. The heat sink according to claim 10, wherein said heat sink pieces comprise a plurality of fins, a portion of said fins being in direct contact with said outer periphery edge of said adjacent bottom parts.

17. The method of manufacturing the heat sink according to claim 11, wherein said heat sink pieces comprise a plurality of fins, a portion of said fins being in direct contact with said outer periphery edge of said adjacent bottom parts.

* * * * *